(12) United States Patent
Cutler

(10) Patent No.: US 6,706,998 B2
(45) Date of Patent: Mar. 16, 2004

(54) SIMULATED LASER SPOT ENLARGEMENT

(75) Inventor: Donald R. Cutler, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 10/339,051

(22) Filed: Jan. 8, 2003

(65) Prior Publication Data

US 2003/0132208 A1 Jul. 17, 2003

Related U.S. Application Data

(60) Provisional application No. 60/348,613, filed on Jan. 11, 2002.

(51) Int. Cl.[7] .............................................. B23K 26/00
(52) U.S. Cl. .............................. 219/121.72; 219/121.67
(58) Field of Search ....................... 219/121.72, 121.67, 219/121.68, 121.85, 121.6

(56) References Cited

U.S. PATENT DOCUMENTS

| | | | |
|---|---|---|---|
| 4,461,947 A | 7/1984 | Ward ........................... | 219/121 |
| 4,532,402 A | 7/1985 | Overbeck ............. | 219/121 LU |
| 4,544,889 A | 10/1985 | Hendriks et al. ........ | 324/158 P |
| 4,670,638 A | 6/1987 | Pavlin .................. | 219/121 LU |
| 4,896,944 A | 1/1990 | Irwin et al. ................. | 350/247 |
| 4,941,082 A | 7/1990 | Pailthorp et al. ...... | 364/167.01 |
| 4,970,600 A | * 11/1990 | Garnier et al. ......... | 219/121.68 |
| 5,074,628 A | 12/1991 | Khattak et al. ............. | 359/205 |
| 5,101,091 A | 3/1992 | Grub et al. ............. | 219/121.74 |
| 5,126,648 A | 6/1992 | Jacobs ........................ | 318/640 |
| 5,208,818 A | 5/1993 | Gelbart et al. ................ | 372/30 |
| 5,223,692 A | 6/1993 | Lozier et al. .......... | 219/121.67 |
| 5,229,951 A | 7/1993 | Sugita et al. .......... | 364/474.29 |
| 5,262,707 A | 11/1993 | Okazaki et al. ............. | 318/592 |
| 5,280,378 A | 1/1994 | Lombardo ................... | 359/199 |
| 5,382,770 A | 1/1995 | Black et al. ........... | 219/121.63 |
| 5,449,882 A | 9/1995 | Black et al. ........... | 219/121.83 |

(List continued on next page.)

FOREIGN PATENT DOCUMENTS

| | | | |
|---|---|---|---|
| EP | 0 976 487 | 2/2000 | ........... B23K/26/06 |
| JP | 54 116356 A | 9/1979 | ........... B23K/26/00 |
| WO | WO 99/63793 | 12/1999 | ............ H05K/3/00 |

OTHER PUBLICATIONS

International Search Report concerning corresponding International Application No. PCT/US01/10391.
"S–330 $q_x q_y$ Ultra–Fast Piezo Tip/Tilt Platforms," http://www.physikinstruments.com/pztactiveoptics/3_10.html, Feb. 5, 2002.
"Precision Fast–steering Mirrors," Ball Aerospace & Technologies Corp., http://www.ball.com/aerospace/pfsm.html; Dec. 26, 2000.
International Search Report concerning corresponding International Application No. PCT/US03/00686.

Primary Examiner—M. Alexandra Elve
(74) Attorney, Agent, or Firm—Stoel Rives LLP

(57) ABSTRACT

An fast steering mirror (30), such as a PMN actuated mirror, is positioned in a beam path (18) of a stage-based positioning system (40) to continuously move a laser beam (46) in a high speed prescribed pattern about a nominal target position (60) to spatially separate focused laser spots (48) generated at a high laser repetition rate and thereby create geometric features having dimensions greater than those of the focused laser spot (48). A series of laser spots (48) at a given repetition rate appear as a series of larger diameter laser spots at a lower pulse rate without beam quality problems associated with working out of focus.

22 Claims, 5 Drawing Sheets

U.S. PATENT DOCUMENTS

| | | | |
|---|---|---|---|
| 5,452,275 A | 9/1995 | Ogawa | 369/44.11 |
| 5,484,982 A | 1/1996 | Nihei et al. | 219/121.79 |
| 5,493,095 A | 2/1996 | Bruschi et al. | 219/121.75 |
| 5,526,165 A | 6/1996 | Toda et al. | 359/202 |
| 5,536,916 A | 7/1996 | Kohari et al. | 219/121.83 |
| 5,571,430 A | 11/1996 | Kawasaki et al. | 219/121.78 |
| 5,578,227 A | 11/1996 | Rabinovich | 219/121.63 |
| 5,593,606 A | 1/1997 | Owen et al. | 219/121.71 |
| 5,653,900 A | 8/1997 | Clement et al. | 219/121.68 |
| 5,751,585 A | 5/1998 | Cutler et al. | 364/474.03 |
| 5,790,156 A | 8/1998 | Mutton et al. | 347/71 |
| 5,798,927 A | 8/1998 | Cutler et al. | 364/474.3 |
| 5,841,099 A | 11/1998 | Owen et al. | 219/121.69 |
| 5,847,960 A | 12/1998 | Cutler et al. | 364/474.29 |
| 5,907,441 A | 5/1999 | Sapy | 359/849 |
| 5,946,152 A | 8/1999 | Baker | 359/872 |
| 6,100,498 A | 8/2000 | Nakata | 219/121.72 |
| 6,118,570 A | 9/2000 | Kanai et al. | 359/210 |
| 6,407,363 B2 | 6/2002 | Dunsky et al. | 219/121.71 |
| 6,423,928 B1 * | 7/2002 | Piwczyk | 219/121.67 |
| 6,430,465 B2 | 8/2002 | Cutler | 700/193 |
| 6,462,301 B1 * | 10/2002 | Scott et al. | 219/121.67 |

* cited by examiner

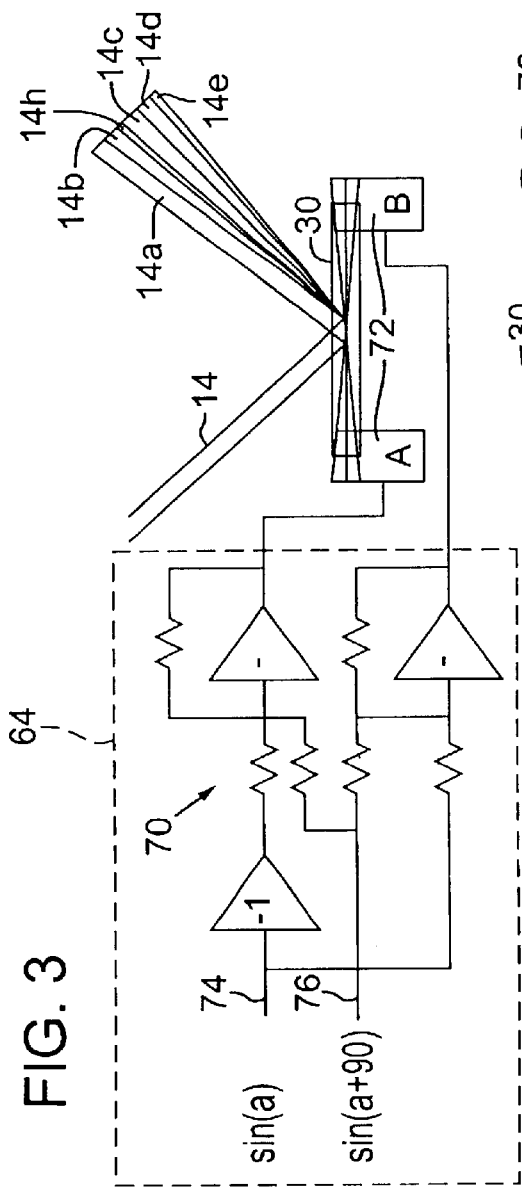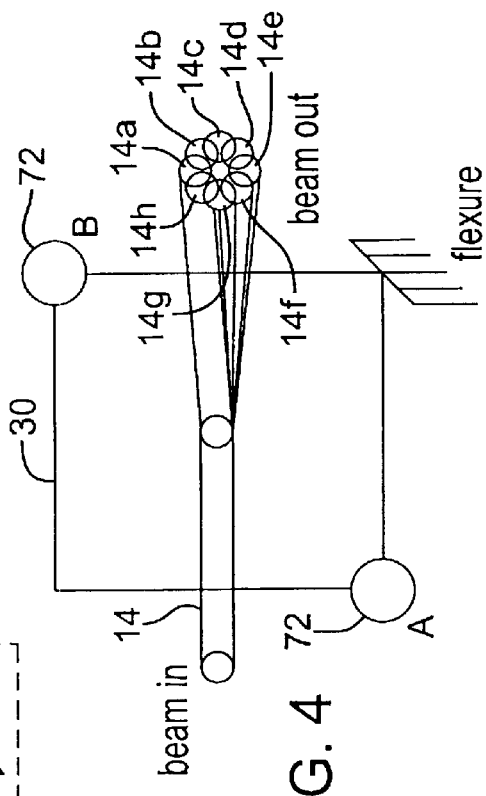

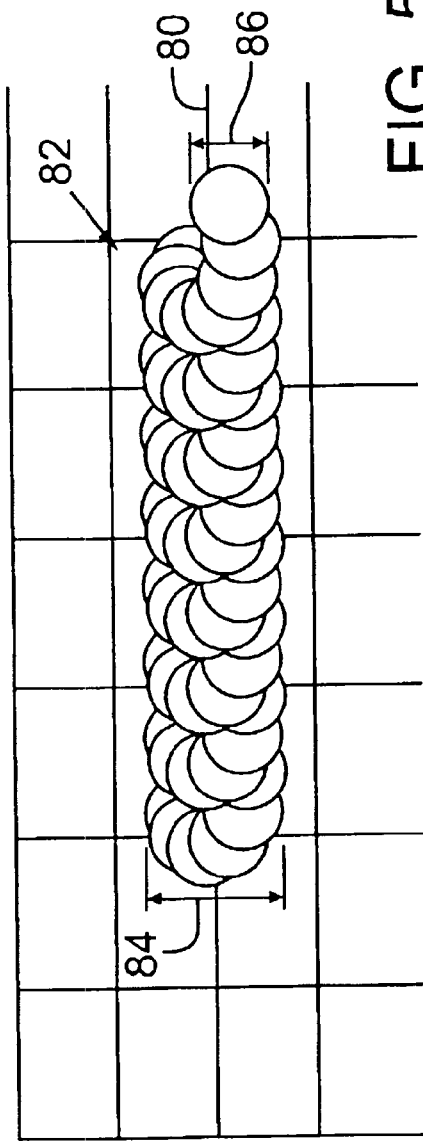

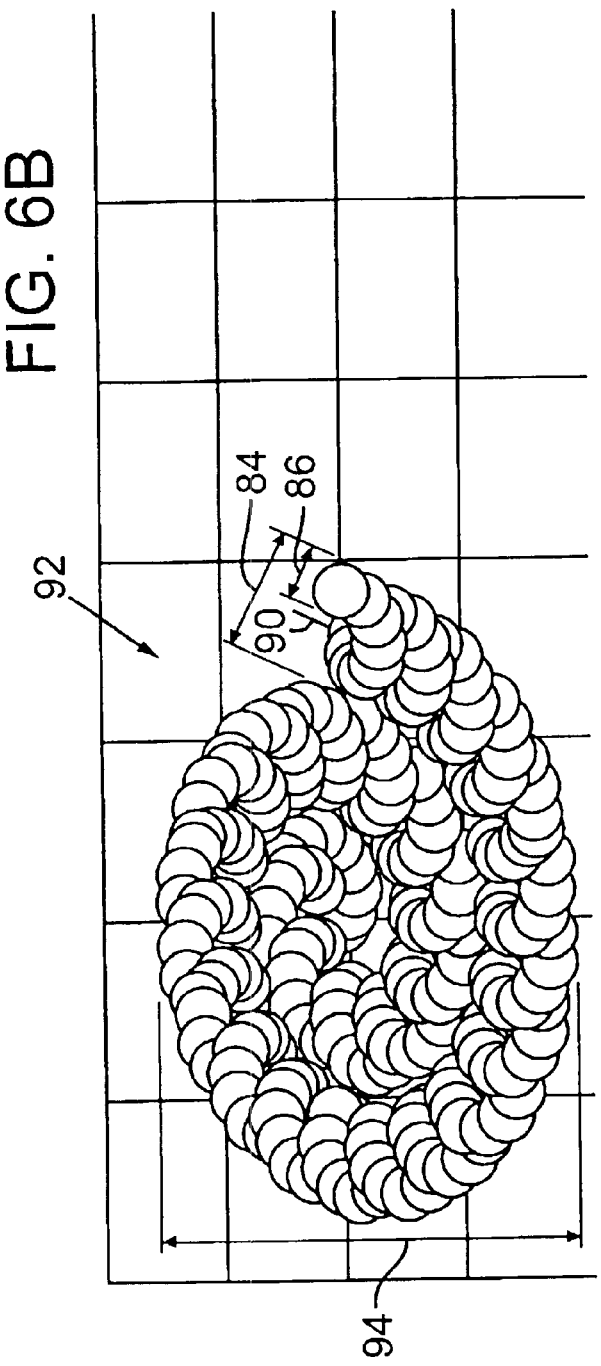
FIG. 6A
FIG. 6B

SIMULATED LASER SPOT ENLARGEMENT

RELATED APPLICATIONS

This patent application derives priority from U.S. Provisional Application No. 60/348,613, filed Jan. 11, 2002.

TECHNICAL FIELD

The present invention relates to laser micromachining and, in particular, to a method and apparatus employing an fast steering mirror to move a laser spot having a focused spot size in a desired pattern on a substrate to remove a target area that is larger than the focused spot size on the substrate.

BACKGROUND OF THE INVENTION

The background is presented herein only by way of example to multilayer electronic work pieces, such as integrated-circuit chip packages, multichip modules (MCMs) and high-density interconnect circuit boards, that have become the most preferred components of the electronics packaging industry.

Devices for packaging single chips such as ball grid arrays, pin grid arrays, circuit boards, and hybrid microcircuits typically include separate component layers of metal and an organic dielectric and/or reinforcement materials, as well as other new materials. Much recent work has been directed toward developing laser-based micromachining techniques to form vias in, or otherwise process, these types of electronic materials. Vias are discussed herein only by way of example to micromachining and may take the form of complete through-holes or incomplete holes called blind vias. Unfortunately, laser micromachining encompasses numerous variables including laser types, operating costs, and laser- and target material-specific operating parameters such as beam wavelength, power, and spot size, such that the resulting machining throughputs and hole quality vary widely.

Pulsed ultraviolet (UV) lasers currently used in micromachining operations produce relatively small spot sizes compared to the kerf widths and hole diameters desired for many applications. Laser machining throughput for creation of such feature geometries that are large compared to the laser spot size, hereinafter referred to as "contoured machining," may be increased by employing a larger and lower power density laser beam. As described in U.S. Pat. No. 5,841,099, by operating the laser out of focus, Owen et al. can effectively enlarge the laser spot size and reduce its energy density. U.S. Pat. No. 5,593,606 and U.S. Pat. No. 5,841,099, both of Owen et al. describe advantages of employing UV laser systems to generate laser output pulses within advantageous parameters to form vias or blind vias in multilayer devices. These patents mention well known techniques in which vias having diameters larger than that of the focused spot size may be produced by trepanning, concentric circle processing, or spiral processing. These techniques will hereinafter be collectively referred to as "contoured drilling."

Unfortunately, operating the laser out of focus often results in unpredictable and undesirable energy distribution and spot shape and adversely impacts via quality, including the via wall taper, the degree of melting of the copper layer at the bottom of the via, and the height of the "rim" around the periphery of the via caused by the splash of molten copper during drilling. Furthermore, because the spot size entering conventional collimating and focusing optics is inversely proportional to the spot size impacting the target, the power density applied to the optics quickly exceeds the damage threshold of the optics.

U.S. Pat. No. 4,461,947 of Ward discloses a method of contoured drilling in which a lens is rotated within a plane perpendicular to an incident laser beam to affect a target area that is greater in size than that of the focused laser spot. The lens rotation is independent of the position of the supporting mounting arm. Ward also discloses a prior art method of contoured drilling that relies on movement of the mounting arm within a plane to effect lens rotation. In the background, Ward discloses that the beam may be rotated by a rotating mirror.

U.S. Pat. No. 5,571,430 of Kawasaki et al. discloses a laser welding system that employs a concave condensing mirror that is pivotal about a first axis and supported by a rotary support member on a bearing such that the mirror is rotatable about a second axis perpendicular to the first axis. The mirror is oscillated about the first axis to increase the "width" of target removed and rotated about the second axis to create an annular pattern.

SUMMARY OF THE INVENTION

An object of the present invention is, therefore, to provide a method or apparatus for quickly spatially spreading out the focused laser spots, and therefore the energy density, of high repetition rate laser pulses.

Another object of the invention is rapidly create geometric features having dimensions greater than those of the focused laser spot.

A further object of the invention is to improve the throughput and/or quality of work pieces in such laser machining operations.

U.S. Pat. Nos. 5,751,585 and 5,847,960 of Cutler et al. and U.S. Pat. No. 6,430,465 B2 of Cutler include descriptions of split-axis positioning systems, in which the upper stage is not supported by, and moves independently from, the lower stage and in which the work piece is carried on one axis or stage while the tool is carried on the other axis or stage. These positioning systems have one or more upper stages, which each support a fast positioner, and can process one or multiple work pieces simultaneously at high throughput rates because the independently supported stages each carry less inertial mass and can accelerate, decelerate, or change direction more quickly than can those of a stacked stage system. Thus, because the mass of one stage is not carried on the other stage, the resonance frequencies for a given load are increased. Furthermore, the slow and fast positioners are adapted to move, without necessarily stopping, in response to a stream of positioning command data while coordinating their individually moving positions to produce temporarily stationary tool positions over target locations defined by the database. These split-axis, multirate positioning systems reduce the fast positioner movement range limitations of prior systems while providing significantly increased tool processing throughput and can work from panelized or unpanelized databases.

Although such split-axis positioning systems are becoming even more advantageous as the overall size and weight of the work pieces increase, utilizing longer and hence more massive stages, they may not provide sufficient bandwidth to effectively spread out the energy by large geometric spacing between the laser pulses at high pulse repetition frequencies (PRFs).

The present invention employs, therefore, an fast steering mirror, such as a piezoelectrically controlled mirror, in the beam path to continuously move the laser beam in a high speed prescribed pattern about a nominal target position to spatially separate the focused laser spots generated at a high laser repetition rate and thereby create geometric features having dimensions greater than those of the focused laser spot. The invention permits a series of laser pulses at a given repetition rate to appear as a series of larger diameter pulses at a lower pulse rate without the beam quality problems associated with working out of focus.

Additional objects and advantages of this invention will be apparent from the following detailed description of preferred embodiments thereof which proceeds with reference to the accompanying drawings.

BRIEF DESCRIPTION OF THE DRAWINGS

FIG. 3 is a partly sectional and partly schematic view of an fast steering mirror mechanism employed in the laser system of FIG. 1.

FIG. 4 is a frontal view of the fast steering mirror demonstrating how mirror flexion can affect the position of the laser spot.

FIG. 5 is computer model of an exemplary straight line kerf-forming profile enhanced by movement of an fast steering mirror in accordance with the present invention.

FIG. 6 is computer model of an exemplary via drilling profile enhanced by movement of an fast steering mirror in accordance with the present invention.

DETAILED DESCRIPTION OF PREFERRED EMBODIMENT

Figure 1:
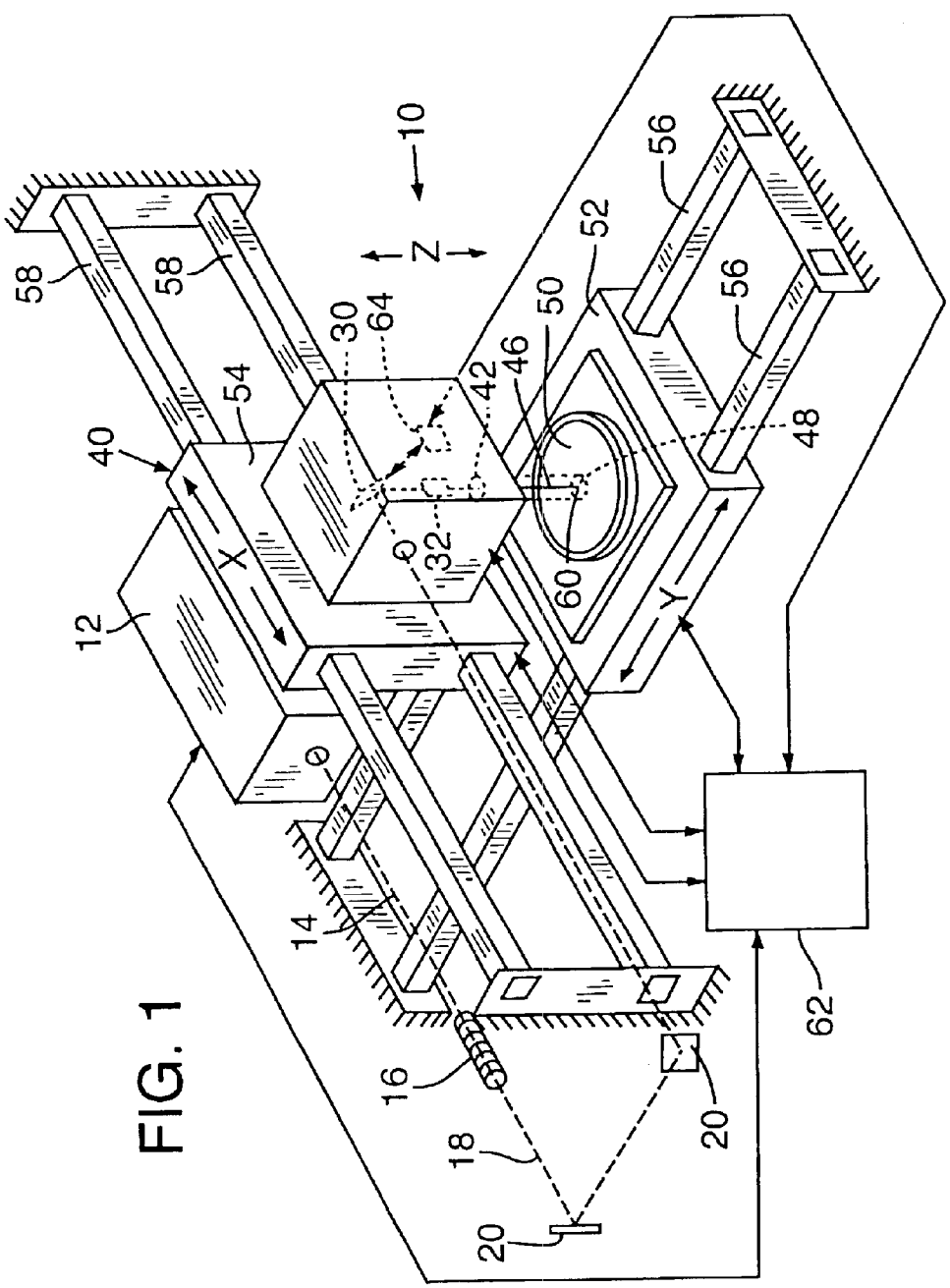
FIG. 1 is a partly isometric and partly schematic view of a simplified laser system incorporating fast steering mirror in accordance with present invention.

With reference to FIG. 1, an exemplary embodiment of a laser system 10 of the present invention includes Q-switched, diode-pumped (DP), solid-state (SS) laser 12 that preferably includes a solid-state lasant. Skilled persons will appreciate, however, pumping sources other than diodes, such as a krypton arc lamp, are also available. The pumping diodes, arc lamp, or other conventional pumping means receive power from a power supply (not shown separately) which may form part of laser 12 or may be positioned separately.

The exemplary laser 12 provides harmonically generated laser output 14 of one or more laser pulses having primarily a $TEM_{00}$ spatial mode profile. Preferred laser wavelengths from about 150 nanometers (nm) to about 2000 nm include, but are not limited to, 1.3, 1.064, or 1.047, 1.03–1.05, 0.75–0.85 microns ($\mu$m) or their second, third, fourth, or fifth harmonics from Nd:YAG, Nd:YLF, Nd:YVO$_4$, Nd:YAP, Yb:YAG, or Ti:Sapphire lasers 64. Such harmonic wavelengths may include, but are not limited to, wavelengths such as about 532 nm (frequency doubled Nd:YAG), 355 nm (frequency tripled Nd:YAG), 266 nm (frequency quadrupled Nd:YAG), or 213 nm (frequency quintupled Nd:YAG). Lasers 12 and harmonic generation techniques are well known to skilled practitioners. Details of one exemplary laser 12 are described in detail in U.S. Pat. No. 5,593,606 of Owen et al. An example of a preferred laser 12 includes a Model 210 UV-3500 laser sold by Lightwave Electronics of Mountain View, Calif. Skilled persons will appreciate that lasers emitting at other suitable wavelengths are commercially available, including fiber lasers, or Q-switched $CO_2$ lasers, and could be employed. An exemplary Q-switched $CO_2$ laser is disclosed in U.S. Pat. Pub. No. US 2002/0185474 A1 of Dunsky et al. published on Dec. 12, 2002.

With reference to FIG. 1, laser output 14 may be manipulated by a variety of well-known optics including beam expander lens components 16 that are positioned along beam path 18 before being directed by a series of beam-directing components 20 (such as stage axis positioning mirrors), fast steering mirror FSM (30), and fast positioner 32 (such as a pair of galvanometer-driven X- and Y-axis mirrors) of beam positioning system 40. Finally, laser output 14 is passed through a objective lens 42, such as a focusing or telecentric scan lens, before being applied as laser system output beam 46 with laser spot 48 at work piece 50.

A preferred beam positioning system 40 is described in detail in U.S. Pat. No. 5,751,585 of Cutler et al. and may include ABBE error correction means described in U.S. Pat. No. 6,430,465 B2 of Cutler. Beam positioning system 40 preferably employs a translation stage positioner that preferably controls at least two platforms or stages 52 and 54 and supports positioning components 20 to target and focus laser system output beam 46 to a desired laser target position 60. In a preferred embodiment, the translation stage positioner is a split-axis system where a Y stage 52, typically moved by linear motors, supports and moves work piece 50 along rails 56, an X stage 54 supports and moves fast positioner 32 and objective lens 42 along rails 58, the Z dimension between the X and Y stages is adjustable, and beam-directing components 20 align the beam path 18 through any turns between laser 12 and FSM 30. A typical translation stage positioner is capable of a velocity of 500 mm/sec and an acceleration of 1.5 G. For convenience, the combination of the fast positioner 32 and one or more translation stages 52 and/or 54 may be referred to as a primary or integrated positioning system.

Beam positioning system 40 permits quick movement between target positions 60 on the same or different circuit boards or chip packages to effect unique or duplicative processing operations based on provided test or design data. An exemplary fast positioner is capable of a velocity of 400 or 500 mm/sec and an acceleration of 300 or 500 G, and hence these are also the typical capabilities of an exemplary integrated positioning system. An example of a preferred laser system 10 that contains many of the above-described positioning system components is a Model 5320 laser system or others in its series manufactured by Electro Scientific Industries, Inc. (ESI) in Portland, Oreg. Skilled persons will appreciate, however, that a system with a single X-Y stage for work piece positioning and a fixed beam position and/or stationary galvanometer for beam positioning may alternatively be employed.

A laser system controller 62 preferably synchronizes the firing of laser 12 to the motion of stages 52 and 54 and fast positioner 32 in a manner well known to skilled practitioners. Laser system controller 62 is shown generically to control fast positioner 32, stages 52 and 54, laser 12, and FSM controller 64. Skilled persons will appreciate that laser system controller 62 may include integrated or independent control subsystems to control and/or provide power to any or all of these laser components and that such subsystems may be remotely located with respect to laser system controller 62. Laser system controller 62 also preferably controls the movement, including direction, tilt angles or rotation, and speed or frequency, of FSM 30, either directly or indirectly through a mirror controller 64, as well as controls any synchronization with laser 12 or components of positioning system 40. For convenience, the combination of FSM 30 and mirror controller 62 may be referred to as the secondary or nonintegrated positioning system.

The parameters of laser system output beam 46 are selected to facilitate substantially clean, sequential drilling, i.e., via formation, in a wide variety of metallic, dielectric, and other material targets that may exhibit different optical absorption, ablation threshold, or other characteristics in response to UV or visible light. Exemplary parameters of laser system output include average energy densities greater than about 120 microjoules ($\mu$J) measured over the beam spot area, preferably greater than 200 $\mu$J; spot size diameters or spatial major axes of less than about 50 $\mu$m, and preferably from about 1–50 $\mu$m, and typically from about 20–30 $\mu$m; a repetition rate of greater than about 1 kiloHertz (kHz), preferably greater than about 5 kHz, and most preferably even higher than 20 kHz; and a wavelength preferably between about 150–2000 nm, more preferably between about 190–1325 nm, and most preferably between about 266 mm and 532 nm. The preferred parameters of laser system output beam 46 are selected in an attempt to circumvent certain thermal damage effects by utilizing temporal pulse widths that are shorter than about 100 nanoseconds (ns), and preferably from about 0.1 picoseconds (ps) to 100 ns, and more preferably from about 1–90 ns or shorter. Skilled persons will appreciate that these parameters will vary and can be optimized for the material to be processed, and that different parameters may be used to process different target layers.

Laser system output beam 46 preferably produces a spot area 48 of a diameter of less than about 25–50 $\mu$m at beam position 60 on work piece 50. Although spot area 48 and diameter generally refer to 1/e² dimensions, especially with respect to the description of laser system 10, these terms are occasionally used to refer to the spot area or diameter of the hole created by a single pulse. Skilled persons will also appreciate that the spot area 48 of output beam 46 is generally circular, but may be shaped to be substantially square. Skilled persons will also appreciate that output beam 46 can be imaged or clipped of its wings or tails, particularly for first step processing, if desired for specific operations.

Figure 2:
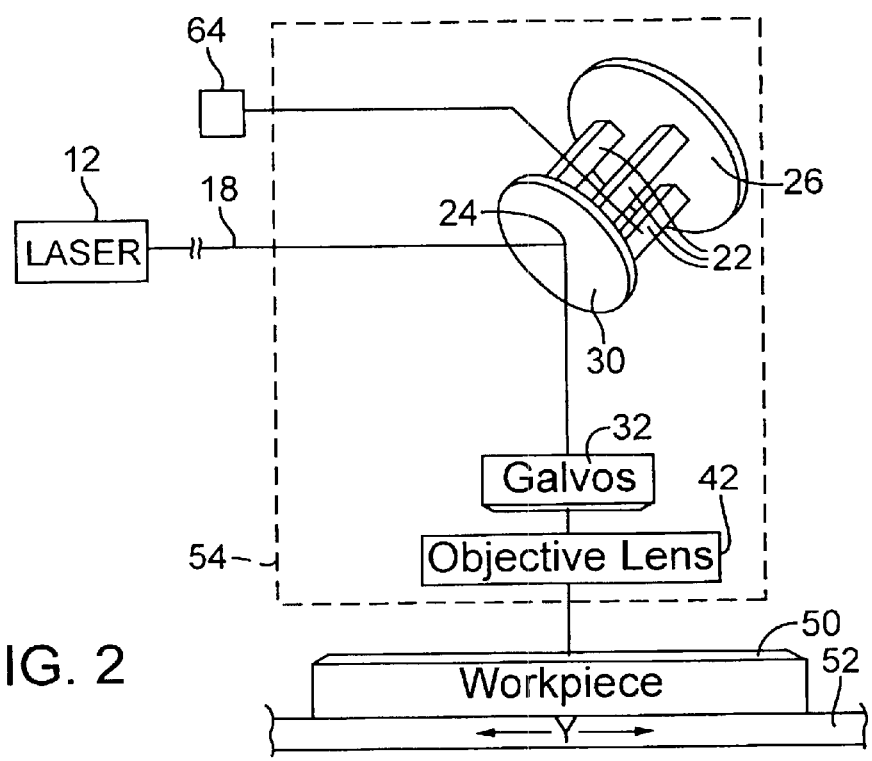
FIG. 2 is a partly pictorial and partly schematic view of an fast steering mirror mechanism employed in the laser system of FIG. 1.

FIG. 2 shows a preferred embodiment of an FSM 30 that is positioned to receive laser output 14, deflect it through fast positioner 32, through objective lens 42 to a target position 60 on work piece 50 for the purpose of ECB via drilling, circuit element trimming, or other micro-machining applications. FSM 30 is preferably implemented as part of a limited deflection beam positioning stage employing electrostrictive actuators having a higher frequency response than the fast positioner 32. FSM 30 is deflected by ferroelectric ceramic actuator material, such as lead magnesium niobate (PMN), actuators 22 that translate voltage into displacement. PMN material is similar to the more common piezoelectric actuator material but has less than 1 percent hysteresis, high electromechanical conversion efficiency, exhibits wide operating and manufacturing temperature ranges, does not require permanent polarization, and provides useful mechanical activity with small electrical drive voltages.

Exemplary PMN actuators 22 have a limited displacement of about 20 microns for a 40 mm long cylinder of PMN material, but have a very high stiffness of about 210 Newtons per micron for a 5 mm diameter cylinder. FSM 30 is coupled through a flexure to three PMN actuators 22 having first ends arranged as an equilateral triangle having its center aligned with a center 24 of FSM 120. The second ends of PMN actuators 22 are mechanically coupled to a mount 26 that attaches to X-axis translation stage 54. The three PMN actuators 22 are preferably implemented in a 3-degree of freedom configuration that is used in a 2-degree of freedom mode to tilt and tip FSM 30. The three PMN actuators 22 are preferably formed as a hollow cylinder of PMN material that is electrically circumferentially divided into three active regions. Activating a region causes it to expand or contract, thereby tipping or tilting FSM 30.

Preferably the actuator triangle has 5 mm sides such that FSM 30 can be deflected at about a ±4 milliRadian ("mRad") angle, which translates into a ±640 micron deflection of laser output 14 when projected onto work piece 50 with an 80 mm objective lens 42. An exemplary FSM 30 may provide a typical range of travel limit that limits the pattern dimension to up to about 25 or 50 times the laser spot size; however, a the maximum frequency response of the FSM 30 may be a more constraining limit that limits the pattern dimension to up to about 15 times the laser spot size, and typically up to 5 to 10 times the laser spot size. FSM 30 operates at higher frequencies and accelerations than exemplary galvanometer-driven X- and Y-axis mirrors of fast positioner 32. An exemplary FSM 30 of the nonintegrated positioning system provides velocities of greater than 1,000 mm/sec and may be capable of velocities of 4,000 mm/sec or higher, which are 5 to 10 times the velocity of the typical integrated positioning system. An exemplary FSM 30 of the nonintegrated positioning system provides accelerations of greater than 1,000 G and may be capable of accelerations of 30,000 G or greater, which are 50 to 100 times the acceleration of the typical integrated positioning system.

In particular, exemplary PMN actuators 22 have about a 2.0 microFarad characteristic capacitance, 1.0 ohm DC impedance, 17 ohms impedance at 5 kHz, and draws over three amperes of current at 75 volts of drive. The exemplary PMN actuator 22 driving FSM 30 has a large-signal bandwidth greater than about 5 kHz, a small-signal bandwidth greater than about 8 kHz, and a deflection angle of at least about 4 mRad for deflecting laser output 14 with about ±0.5 micron positioning resolution.

Skilled persons will appreciate that any other precision high-bandwidth actuators could be employed for mirror actuators 22. FIG. 3 is a partly sectional and partly schematic view of an alternative FSM 30 along with some exemplary control circuitry 70 of an exemplary mirror controller 64 for mirror actuators 72a and 72b (generically mirror actuators 72), which are preferably piezoelectric-type (PZT) devices, that are employed to make small changes in the angle of FSM 30 resulting in small changes in the angle of laser system output beam 46 that causes small changes in the position 60 of the laser spot 48 at the surface of work piece 50. FIG. 4 is a frontal view of FSM 30 demonstrating how mirror flexion can affect the position 60 of the laser spot 48.

With reference to FIGS. 3 and 4, in an exemplary embodiment employing PZT mirror actuators 72, one corner of a generally rectangular FSM 30 is anchored to a reference structure with a flexure that can flex but not compress or stretch. Two other corners of FSM 30 are driven by the piezoelectric mirror actuators 72a and 72b in response to sine waves to introduce small angles into the beam path 18 that cause small changes in the beam position of laser spot 48 superimposed on target positions 60 established by other components of beam positioning system 40.

In a preferred embodiment, the sine (a) signal 74 drives the piezoelectric mirror actuators 72a and 72b in opposite directions to create an angle change in one direction, and the sine (a+90 degrees) signal 76 drives the piezoelectric mirror actuators 72a and 72b in the same direction by sine to create an angle change at 90 degrees to the first angle change. The laser output 14 is reflected off FSM 30 at a point approximately in the center. This results in a circle motion at the work surface after the small angles introduced by the mirror movement are converted to position changes by the scan lens 42.

For laser drilling operations, a preferred objective lens focal length is about 50–100 mm, and a preferred distance from the FSM 30 to scan lens 42 is as small as practical within design constraints and preferably less than about 300 mm, and more preferably less than 100 mm, when the Z stage (not shown) is at its normal focus height. In a preferred laser system 10, FSM 30 is mounted up stream of fast positioner 32 on the X stage 54 and replaces the final turn mirror of some conventional beam positioning systems. In a preferred embodiment, FSM 30 is adapted for easy upgrade of existing lasers and positioning systems 40, such as employed in models 5200 or 5320 manufactured by Electro Scientific Industries, Inc. of Portland Oreg., and can be easily exchanged for the final turn mirror on the X stages 54 of conventional laser systems. Skilled persons will appreciate that FSM 30 could be positioned in the beam path 18 but mounted somewhere other than on the X stage 54.

Skilled persons will appreciate that various technologies may alternatively be employed to control movement of an FSM 30 in two axes about a pivot point, such as center 24. These technologies include FSMs 30 that employ a flexure mechanism and voice coil actuators, piezoelectric actuators that rely upon deformation of piezoelectric, electrostrictive, or PMN actuators materials, and piezoelectric or electrostrictive actuators to deform the surface of a mirror. Exemplary voice coil actuated FSMs 30 are described in U.S. Pat. No. 5,946,152 of Baker and can be adapted to work at high frequencies. Suitable voice coil actuated FSMs 30 are available from Ball Aerospace Corporation of Broomfield, Colo. and Newport Corporation of Irvine, Calif. A suitable piezoelectric actuator is a model S-330 Ultra-Fast Piezo Tip/Tilt Platform manufactured by Physik Instrumente ("PI") GmbH & Co. of Karlsruhe, Germany.

In applications for simulated laser spot enlargement, the laser controller 64 commands the stages 52 and 54 and fast positioner 32 of the integrated positioning system to follow a predetermined tool path, such as a trimming profile or a blind via drilling profile, while the mirror controller 64 independently causes FSM 30 to move the laser spot position of laser system output beam 46 in a desired pattern, such as small circles or oscillations. This superimposed, free running beam movement or vibration distributes the energy of laser system output beam 46 over a larger area and effectively makes a wider cut along the tool path. The effective kerf width is generally equal to the size of the pattern dimension plus the spot diameter. The beam movement also spreads the laser energy over a larger area to effectively increase the area that can be treated with a given average energy density within a period of time.

Because the commands of mirror controller 64 sent FSM 30 are not integrated with, but superimposed on, the positioning commands addressed to the stages 52 and 54 and fast positioner 32 of the integrated positioning system, a great deal of complexity and expense is avoided while a great deal of increased functionality and throughput is achieved. Mirror controller 64 may, however, cooperate with laser controller 62 to effect particular desired patterns of movement of laser system output beam 46 during particular laser applications or particular tool paths of the integrated positioning system. The FSM-effective spot pattern may be selected to have a pattern dimension to obtain a particular kerf width, such as for a trimming operation, and/or may be selected to impart a particular hole edge quality, such as during a via drilling operation. Skilled persons will appreciate, however, that the mirror controller 64 can be directly programmed by a user and does not need to cooperate with, nor be controlled through, the laser controller 62.

A computer graphics model was developed to show individual placement of laser spots 48 at the work surface resulting from continuous movement of FSM 30 by PZT actuators as described above. FIG. 5B is computer model of an exemplary straight-line kerf-forming tool path 80 of FIG. 5A, enhanced by movement of FSM 30. With reference to FIGS. 5A and 5B (collectively FIG. 5), the parameters include: a PRF of about 18 kHz; a spot size of about 25 $\mu$m; a linear velocity (the rate the small rotating circular pattern is moving across the work surface) of about 50 mm/sec; a rotation rate (the rate the circular pattern is rotating) of about 2 kHz; a rotation aptitude (the diameter of the circular pattern (to center of beam)) of about 30 $\mu$m; an inside diameter (the starting diameter of the spiral pattern (to center of circular pattern)) of about 10 $\mu$m; an outside diameter (the end diameter of spiral pattern (to center of circular pattern)) of about 150 $\mu$m; and a number of cycles (the number of rotations of the spiral pattern) of about 2. The model shows that in order to support laser pulse rates in the 15 to 20 kHz range, a rotation rate of 1 kHz to 2.5 kHz (5 to 15 pulses per rotation) is desired for a practical pulse overlap.

With reference again to FIG. 5, mirror-enhanced straight-line profile 82 creates a kerf width 84 that is larger than the spot diameter 86 of output beam 46. This technique permits a kerf wider than the spot diameter 86 to be formed in fewer passes while maintaining the machining quality and other benefits of using a focused output beam 46 (i.e. without defocusing the beam to achieve a wider spot). In addition, the mirror-enhanced straight-line profile 82 may be beyond the bandwidth capabilities of most fast positioners 32 for high repetition rate applications and allows the fast positioners 32 to retain simple positioning movement instructions, as opposed to the sub patterning that would otherwise be required to have them effect the subpatterns evident in the mirror enhanced straight line profile 82.

FIG. 6B is computer model of an exemplary via-forming spiral tool path 90 (FIG. 6A) enhanced by movement of FSM 30. With reference to FIGS. 6A and 6B (collectively FIG. 6), the parameters include: a PRF of about 15 kHz; a spot size of about 15 $\mu$m; a linear velocity (the rate the small rotating circular pattern is moving across the work surface) of about 30 mm/sec; a rotation rate (the rate the circular pattern is rotating) of about 1.5 kHz; a rotation aptitude (the diameter of the circular pattern (to center of beam)) of about 20 $\mu$m; an inside diameter (the starting diameter of the spiral pattern (to center of circular pattern)) of about 10 $\mu$m; an outside diameter (the end diameter of spiral pattern (to center of circular pattern)) of about 150 $\mu$m; and a number of cycles (the number of rotations of the spiral pattern) of about 2. The model shows that in order to support laser pulse rates in the 15 to 20 kHz range, a rotation rate of 1 kHz to 2.5 kHz (5 to 15 pulses per rotation) is desired for a practical pulse overlap.

In an exemplary embodiment employing a Q-switched $CO_2$ laser system 10 and a PMN FSM 30, the $CO_2$ laser system 10 employs a PRF of 30–40 kHz with 20–30 pulses per via hole. The FSM 30 oscillates the laser system output beam 46 at 1.0–1.5 kHz so it makes one complete revolution as the hole is drilled, and the drill time takes less than 0.6–1 ms.

With reference to FIG. 6, a blind via is formed by sequentially directing laser system output beam 46 having spot area 86 at overlapping contiguous locations along a spiral tool path 90 to a periphery. Beam 46 is preferably moved continuously through each location at a speed sufficient for system 10 to deliver the number of beam pulses necessary to achieve the depth of cut at the location. As beam 46 proceeds along the spiral tool path 90, the target material is "nibbled" away to form a hole of increasing size each time beam 46 is moved to a new cutting location. The final shape of the hole is typically achieved when beam 46 moves along a circular path at the periphery.

Skilled persons will note that mirror-enhanced via-drilling profile 92 creates a kerf width 84 that is larger than the spot diameter 86 of output beam 46 such that the diameter 94 of the resulting via is much greater than the diameter would be for a spiral made from a kerf width the same size as the spot size. The invention permits a series of laser pulse spots 48 at a given repetition rate appear as a series of larger-diameter laser pulse spots at a lower pulse rate without the beam quality problems associated with working out of focus. Via diameters or kerf widths typically range from 25–300 μm, but vias or kerfs having diameters or widths as large as or greater than 1 millimeter (mm) may also be desirable.

An alternative tool path to form a blind via would be to start at the center and cut concentric circles of incrementally increasing radii defined by of kerf width 84. The overall diameter of the via would increase as the concentric circles forming via travel in a circular path at greater distances from center of region. Alternatively, this process may begin by defining the desired circumference and processing the edges toward the center. Outward spiral processing tends to be a little more continuous and quicker than concentric circle processing; however, a blind via can also be created by spiraling inward.

Skilled persons will appreciate that either work piece 50 or processing output beam 46 may be fixed or moved relative to the position of the other. In a preferred embodiment, both work piece 50 and processing output beam 46 are moved simultaneously. Several examples of through-hole vias and blind vias of various depths and diameters produced on a number of different substrates are set forth in U.S. Pat. No. 5,593,606. Various via processing techniques, including other tool path profiles, are also disclosed in U.S. Pat. No. 6,407,363 B2 of Dunsky et al., which is herein incorporated by reference. Skilled persons will appreciate that noncircular vias may also be ablated through similar processes. Such vias may, for example, have square, rectangular, oval, slot-like, or other surface geometries.

Skilled persons will also appreciate that the integrated positioning system may be directed toward a single location for processing a small area via and the nonintegrated FSM 30 is used to create a via diameter that is larger than the spot diameter 48 of output beam 46 without significant dwell time and without the complexity of moving the integrated positioning system to perform a tool path such as tool path 90. Furthermore, the via quality, including edge quality and bottom uniformity, could be greatly improved, particularly whenever the laser system output beam 46 is relatively Gaussian.

It will be obvious to those having skill in the art that many changes may be made to the details of the above-described embodiments of this invention without departing from the underlying principles thereof. The scope of the present invention should, therefore, be determined only by the following claims.

What is claimed is:

1. A method for laser machining an effective kerf width on a work piece with laser output pulses, each of the laser pulses having a laser spot diameter on the work piece that is smaller than the effective kerf width, comprising:

imparting, from a primary beam positioning system, primary relative movement of a laser spot position to the work piece at a first set of limited velocities and accelerations, the primary beam positioning system providing a beam positioning pathway from a laser to the laser spot position on the work piece, the primary relative movement defining a primary machining path; and imparting, from a secondary beam positioning system positioned along the beam positioning pathway, secondary relative movement of the laser spot position to the work piece at a second set of velocities and accelerations that are substantially higher than those of the first set, the secondary relative movement being superimposed on the primary relative movement and including a pattern having a pattern dimension, perpendicular to the primary machining path, that is less than or equal to about 15 times the laser spot diameter, the primary and secondary relative movements cooperating to provide the effective kerf width, along the primary machining path, that is generally equal to the pattern dimension plus the spot diameter.

2. The method of claim 1 in which the second set comprises velocities greater than 1,000 mm/sec and accelerations greater than 1,000 G.

3. The method of claim 2 in which the second set comprises velocities from 1,000 to 4,000 mm/sec and accelerations from 1,000 to 30,000 G.

4. The method of claim 1 in which the first set comprises velocities less than 500 mm/sec and accelerations less than 500 G.

5. The method of claim 1 in which the pattern dimension is less than or equal to about 10 times the laser spot diameter.

6. The method of claim 1 in which the secondary beam positioning system has large signal band with greater than about 5 kHz and a small signal bandwidth greater than about 8 kHz.

7. The method of claim 1 in which the secondary beam positioning system comprises a fast steering mirror.

8. The method of claim 7 in which the fast steering mirror comprises a PMN or PZT actuated mirror.

9. The method of claim 1 in which the primary beam positioning system comprises at least one translation and a fast positioner.

10. The method of claim 9 in which the fast positioner comprises at least one galvanometer-driven mirror.

11. The method of claim 9 in which the fast positioner is mounted on a translation stage.

12. The method of claim 11 in which the primary positioning system comprises a split-axis positioning system.

13. The method of claim 1 further comprising performing a via drilling application with the laser output pulses.

14. The method of claim 1 further comprising performing a laser trimming application with the laser output pulses.

15. A method for laser machining an effective kerf width on a work piece with laser output pulses, each of the laser pulses having a laser spot diameter on the work piece that is smaller than the effective kerf width, comprising:

imparting, from a translation stage positioning system, stage-related relative movement of a laser spot position to the work piece at translation stage-limited velocities and accelerations;

imparting, from a fast positioning system, fast relative movement of the laser spot position to the work piece at fast-limited velocities and accelerations, the fast positioning system having higher acceleration capabilities than the translation stage positioning system;

integrating the translation stage positioning system and the fast positioning system to impart primary relative movement of the laser spot position to the work piece at a first set of limited velocities and accelerations, the primary beam positioning system providing a beam positioning pathway from a laser to the laser spot position on the work piece, the primary relative movement defining a primary machining path; and imparting, from a fast steering mirror positioned along the beam positioning pathway, secondary relative movement of the laser spot position to the work piece at a second set of velocities and accelerations that are substantially higher than those of the first set, the secondary relative movement being superimposed on, and nonintegrated with, the primary relative movement and including a pattern having a pattern dimension, perpendicular to the primary machining path, that is less than or equal to about 15 times the laser spot diameter, the primary and secondary relative movements cooperating to provide the effective kerf width, along the primary machining path, that is generally equal to the pattern dimension plus the spot diameter.

16. The method of claim 15 in which the second set comprises velocities greater than 1,000 mm/sec and accelerations greater than 1,000 G.

17. The method of claim 16 in which the second set comprises velocities from 1,000 to 4,000 mm/sec and accelerations from 1,000 to 30,000 G.

18. The method of claim 15 in which the fast-limited velocities and accelerations comprise velocities less than 500 mm/sec and accelerations less than 500 G.

19. The method of claim 15 in which the fast steering mirror comprises a PMN or PZT actuated mirror.

20. The method of claim 15 in which the fast positioner comprises at least one galvanometer-driven mirror.

21. The method of claim 15 in which the primary positioning system comprises a split-axis positioning system.

22. The method of claim 15 further comprising performing a via drilling application with the laser output pulses.

* * * * *